US012652974B2

(12) United States Patent
Jeon et al.

(10) Patent No.: US 12,652,974 B2
(45) Date of Patent: Jun. 9, 2026

(54) METHODS AND SYSTEMS FOR FORMING A LAYER COMPRISING SILICON OXIDE

(71) Applicant: ASM IP Holding, B.V., Almere (NL)

(72) Inventors: Jihee Jeon, Leuven (BE); Timothee Blanquart, Oud-Heverlee (BE); Viljami Pore, Helsinki (FI); Charles Dezelah, Helsinki (FI)

(73) Assignee: ASM IP Holding B.V., Almere (NL)

( * ) Notice: Subject to any disclaimer, the term of this patent is extended or adjusted under 35 U.S.C. 154(b) by 392 days.

(21) Appl. No.: 18/334,058

(22) Filed: Jun. 13, 2023

(65) Prior Publication Data

US 2023/0411147 A1 Dec. 21, 2023

Related U.S. Application Data

(60) Provisional application No. 63/352,846, filed on Jun. 16, 2022.

(51) Int. Cl.

| | |
|---|---|
| ***H01L 21/02*** | (2006.01) |
| ***C23C 16/40*** | (2006.01) |
| ***C23C 16/455*** | (2006.01) |
| ***H01J 37/32*** | (2006.01) |
| ***H10P 14/60*** | (2026.01) |
| ***H10P 14/692*** | (2026.01) |

(52) U.S. Cl.

CPC ........ *H10P 14/6339* (2026.01); *C23C 16/401* (2013.01); *C23C 16/4554* (2013.01); *C23C 16/45553* (2013.01); *H01J 37/32357* (2013.01); *H10P 14/6336* (2026.01); *H10P 14/6684* (2026.01); *H10P 14/69215* (2026.01); *H10P 14/6922* (2026.01); *H01J 2237/2001* (2013.01); *H01J 2237/332* (2013.01)

(58) Field of Classification Search

None

See application file for complete search history.

(56) References Cited

U.S. PATENT DOCUMENTS

| | | | | |
|---|---|---|---|---|
| 10,354,859 | B1 | 7/2019 | Kamiya | |
| 2001/0036754 | A1 * | 11/2001 | Maeda | H01L 21/02337 257/E21.243 |
| 2022/0205096 | A1 | 6/2022 | Abel | |
| 2022/0208543 | A1 | 6/2022 | Soe | |
| 2022/0223408 | A1 | 7/2022 | Kato | |
| 2022/0235456 | A1 | 7/2022 | Matsuki | |
| 2022/0238311 | A1 | 7/2022 | Kubo | |
| 2022/0301867 | A1 * | 9/2022 | Tannos | H01J 37/32724 |
| 2022/0306527 | A1 * | 9/2022 | Woywod | B05D 7/22 |

* cited by examiner

*Primary Examiner* — Asok K Sarkar

(74) *Attorney, Agent, or Firm* — Banner & Witcoff, Ltd.

(57) ABSTRACT

Disclosed are methods and systems for forming a silicon-containing layer on a substrate. The methods comprise executing a plurality of deposition cycles. A deposition cycle comprises a silicon precursor pulse that comprises exposing the substrate to a silicon precursor. The silicon precursor comprises silicon and one or more of a group 13 element and a group 15 element. A deposition cycle further comprises a plasma pulse that comprises exposing the substrate to a plasma treatment. The plasma treatment comprises generating a plasma.

20 Claims, 13 Drawing Sheets

METHODS AND SYSTEMS FOR FORMING A LAYER COMPRISING SILICON OXIDE

FIELD OF INVENTION

The present disclosure generally relates to the field of semiconductor processing methods and systems, and to the field integrated circuit manufacture. In particular, methods and systems suitable for forming layers comprising silicon oxide are disclosed.

BACKGROUND OF THE DISCLOSURE

As integrated circuits continue to scale, and 3D integration of integrated circuits becomes a reality, there is an increased need for silicon-containing materials having excellent conformality and improved material properties such as dielectric constant, resistivity, and wet etch rate resistance. There is additionally an increased need for silicon-containing materials that can be formed using low-temperature processes, such as processes that operate at temperatures of at most 400° C., or at most 300° C., or at most 200° C. For example, there is a need for conformal silicon oxycarbide (SiOC) low-k spacers with high conformality, low leakage, low dielectric constant, and excellent wet etch resistance.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a material comprising silicon, to structures and devices formed using such methods, and to apparatus for performing the methods and/or for forming the structures and/or devices. The layers may be used in a variety of applications, including etch stop layers, back-end-of-line dielectrics, capping layers, spacers, and others.

Described herein is a method that comprises, in the given order: positioning a substrate on a substrate support in a reaction chamber; and executing a plurality of deposition cycles. A deposition cycle comprises a silicon precursor pulse and a plasma pulse. The silicon precursor pulse comprises exposing the substrate to a silicon precursor. The silicon precursor comprises silicon and one or more of a group 13 element and a group 15 element. The plasma pulse comprises exposing the substrate to a plasma treatment. The plasma treatment comprises generating a plasma. Thus, a layer comprising silicon is formed on the substrate.

In some embodiments, the silicon precursor comprises an oxygen atom that is bonded to silicon and to one of a group 13 element and a group 15 element.

In some embodiments, the silicon precursor has the formula

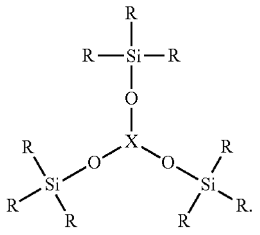

It shall be understood that X is selected from a group 13 element and a group 15 element, and that R is H or an alkyl.

In some embodiments, the silicon precursor has the formula

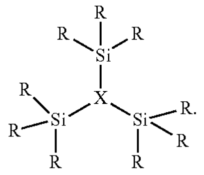

It shall be understood that X is selected from a group 13 element and a group 15 element, and that R is H or an alkyl.

In some embodiments, X is phosphorous. In some embodiments, X is boron. In some embodiments, R is an alkyl. In some embodiments, R is methyl.

In some embodiments, the silicon precursor comprises a silicon-phosphorous bond.

In some embodiments, the silicon precursor has the formula

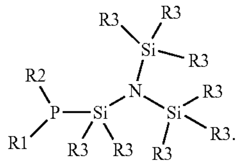

It shall be understood that R1 and R2 are independently selected from silyl and alkylsilyl, and that R3 is H or an alkyl.

In some embodiments, the silicon precursor has the formula

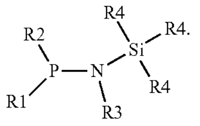

It shall be understood that R1 and R2 are independently selected from silyl and alkylsilyl, that R3 is selected from H and alkylsilyl, and that R4 is selected from H and alkyl.

In some embodiments, the layer comprising silicon comprises one or more of elemental silicon, silicon oxide, silicon carbide, silicon nitride, silicon oxycarbide, silicon oxynitride, silicon carbonitride, and silicon oxycarbonitride.

In some embodiments, the layer comprises silicon oxide.

In some embodiments, the plasma is a direct plasma.

In some embodiments, the plasma is a remote plasma.

In some embodiments, the plasma is an indirect plasma.

In some embodiments, the plasma is generated using a plasma gas. The plasma gas comprises one or more of a noble gas, $H_2$, and $N_2$.

In some embodiments, the noble gas comprises one or more of He and Ar.

In some embodiments, the substrate is maintained at a temperature of at least 200° C. to at most 600° C. during the deposition cycles.

In some embodiments, the reaction chamber is maintained at a pressure of at least 200 Pa to at most 2000 Pa.

Further described herein is a semiconductor processing apparatus. The apparatus comprises a reaction chamber, a heater, a plasma module, a plasma gas source, a silicon precursor source, and a controller. The reaction chamber comprises a substrate support for supporting a substrate.

The heater is constructed and arranged to heat the substrate in the reaction chamber. The plasma module comprises a radio frequency power source that is constructed and arranged to generate a plasma. The plasma gas source is in fluid communication with the plasma module. The silicon precursor source is in fluid connection with the reaction chamber via one or more precursor valves. The controller is configured for causing the semiconductor processing apparatus to perform a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
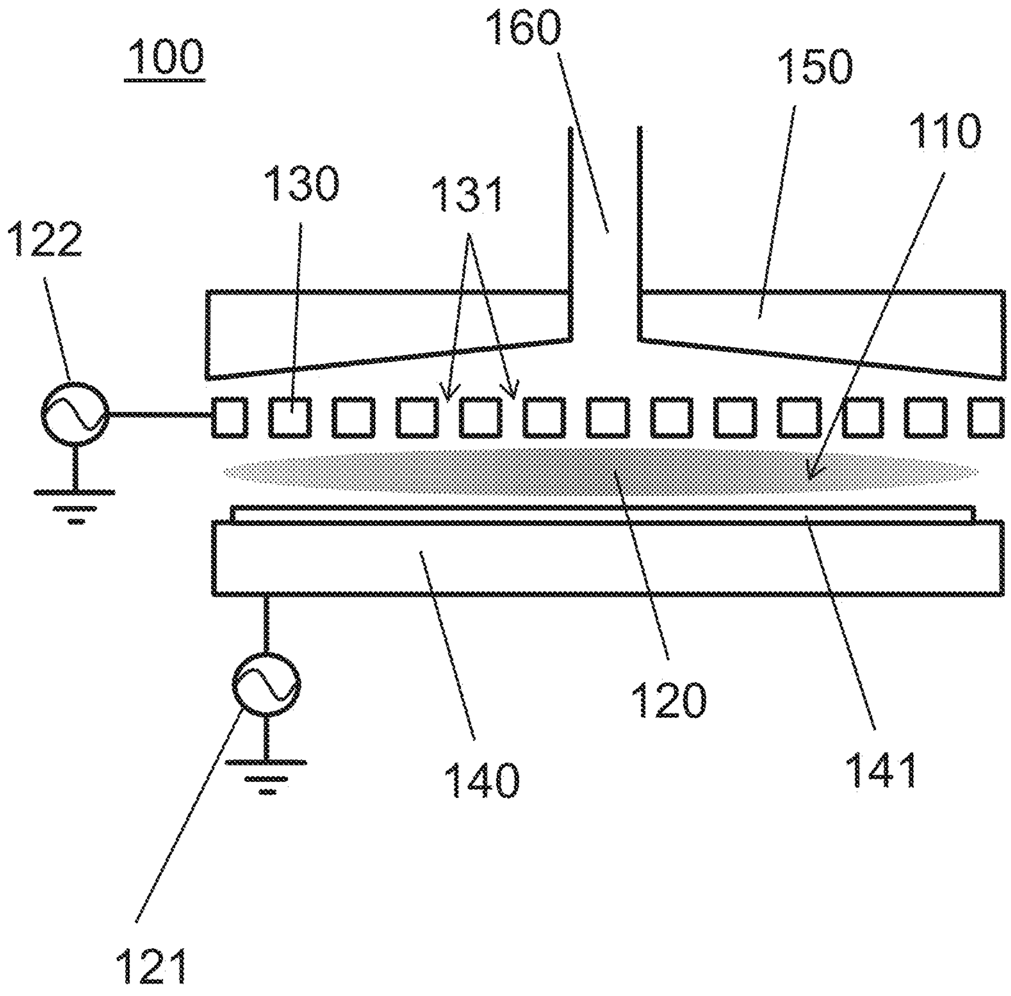
FIG. 1 shows a schematic representation of an embodiment of a system (100) as described herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. Exemplary gasses can include precursors and reactants.

As used herein, the term "comprising" indicates that certain features are included, but that it does not exclude the presence of other features, as long as they do not render the claim or embodiment unworkable. In some embodiments, the term "comprising" includes "consisting". As used herein, the term "consisting" indicates that no further features are present in the apparatus/method/product apart from the ones following said wording. When the term "consisting" is used referring to a chemical compound or substance, it indicates that the chemical compound only contains the components which are listed.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material. Additionally or alternatively, an exemplary substrate can comprise bulk semiconductor material and a conductive layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or include a substrate as described herein. Structures can include one or more layers overlying the substrate, such as one or more layers formed according to a method as described herein. Device portions and interconnects can be or include structures.

The term "deposition process" as used herein can refer to the introduction of precursors (and/or reactants) into a reaction chamber to deposit a layer over a substrate. "Cyclical deposition processes" are examples of "deposition processes".

The term "cyclic deposition process" or "cyclical deposition process" can refer to the sequential exposure of a substrate to precursors (and/or reactants) into a reaction chamber, and exposure of a substrate to plasma generated species to deposit a layer over the substrate and includes processing techniques such as plasma-enhanced atomic layer deposition (PEALD).

The term "plasma-enhanced atomic layer deposition" can refer to a deposition process in which deposition cycles, typically a plurality of consecutive deposition cycles, are conducted in a process chamber.

Generally, for a PEALD processes, during each cycle, a precursor is introduced to a reaction chamber and is chemisorbed to a deposition surface (e.g., a substrate surface that can include a previously deposited material from a previous PEALD cycle or other material) and forming about a monolayer or sub-monolayer of material that does not readily react with additional precursor (i.e., a self-limiting reaction). Thereafter, the substrate is exposed to a plasma-generated species which can be generated using any plasma, such as a direct, indirect, or remote plasma. Plasmas can be generated capacitively, inductively, using microwave radiation, or through other means. The plasma-generated species converts the chemisorbed precursor to the desired material on the deposition surface. Purging steps can be utilized during one or more cycles, e.g., after each step or pulse of each cycle, to remove any excess precursor from the process chamber and/or remove any excess plasma-generated species and/or reaction byproducts from the reaction chamber.

As used herein, the term "purge" may refer to a procedure in which a purge gas is provided to a reaction chamber in between a precursor pulse and a plasma pulse. It shall be understood that during a purge, the substrate is not exposed to plasma-generated species. For example, when a direct plasma is used, the plasma can be turned off during a purge. For example, a purge, e.g. using a purge gas such as nitrogen or a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

In this disclosure, any defined meanings do not necessarily exclude ordinary and customary meanings, in some embodiments.

Described herein is a method that can be employed for forming a silicon-containing material on a substrate. A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc. A substrate can comprise a surface layer on which a layer deposited by means of a method as described herein is formed. Suitable surface layer include conductive layers such as metals or certain nitrides. A suitable nitride includes titanium nitride. Other suitable surface layers include high-k dielectric layers such as hafnium oxide. In some embodiments the substrate comprises a hydroxyl-terminated surface. In other words, in some embodiments, the substrate comprises OH groups on its surface. This can advantageously improve silicon-containing layer depositions using the methods as described herein.

The method comprises positioning a substrate on a substrate support in a reaction chamber. Then, the method comprises executing a plurality of deposition cycles. A deposition cycle comprises a silicon precursor pulse and a plasma pulse. A silicon precursor pulse comprises exposing the substrate to a silicon precursor. The plasma pulse can suitable comprise exposing the substrate to a plasma treatment. Thus, a layer comprising silicon is formed on the substrate.

It shall be understood that the silicon precursor pulses and the plasma pulses are executed sequentially, i.e. one after the other, in a non-overlapping fashion. Optionally, the purges are carried out in between the silicon precursor pulses and the plasma pulses.

The layer comprising silicon can consist of, or can consist substantially of silicon. In other embodiments, the layer comprising silicon comprises one or more additional elements such as oxygen, carbon, and nitrogen. Thus, the layer comprising silicon can, in some embodiments, comprise one or more of silicon oxide, silicon carbide, silicon nitride, silicon oxycarbide, silicon oxynitride, silicon carbonitride, and silicon oxycarbonitride.

In some embodiments, the layer comprising silicon comprises silicon oxide. In some embodiments, the layer comprising silicon comprises silicon oxycarbide.

The silicon precursor can comprise one or more of a group 13 element and a group element.

In some embodiments, the silicon precursor comprises an oxygen atom that is bonded to silicon and to one of a group 13 element and a group 15 element.

In some embodiments, the silicon precursor has a structure according to formula i)

i)

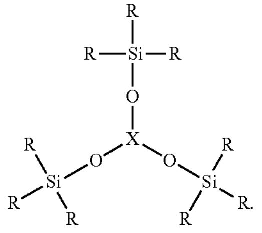

It shall be understood that in formula i), X is selected from a group 13 element and a group 15 element, and wherein R is H or hydrocarbyl. Suitable hydrocarbyls include alkyls, aryls, and alkenyls. In some embodiments, X is phosphorous. In some embodiments, X is boron. In some embodiments, R is an alkyl. In some embodiments, R is methyl.

The silicon precursor can, in some embodiments, comprise tris(trimethylsilyl)phosphite. In other words, and in some embodiments, x is boron and R is methyl in formula i). A method as disclosed herein using tris(trimethylsilyl) phosphite as a silicon precursor can advantageously result in a self-limiting plasma-enhanced atomic layer deposition (PEALD) process that shows self-limiting growth up to temperatures of 500° C. PEALD growth at such high temperatures can result in a very etch resistant silicon containing layer and a high growth-per-cycle.

In some embodiments, a precursor according to formula i) can be employed in an embodiment as described herein together with an $Ar/H_2$ plasma to form an SiOC film, i.e. a film consisting of Si, O, C, and optionally H.

In some embodiments, the silicon precursor has a structure according to formula ii)

ii)

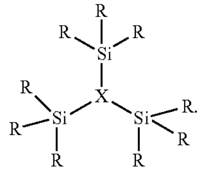

It shall be understood that in formula ii), X is selected from a group 13 element and a group 15 element, and wherein R is H or hydrocarbyl. Suitable hydrocarbyls include alkyls, aryls, and alkenyls. In some embodiments, X can be phosphorous. In some embodiments, X can be boron. In some embodiments, R is an alkyl. In some embodiments, R is methyl.

In some embodiments, the silicon precursor can comprise a silicon-oxygen-phosphorous functional group. In other words, the silicon precursor can comprise an oxygen atom that is bonded to silicon and to phosphorous.

In some embodiments, the silicon precursor can comprise a silicon-oxygen-boron functional group. In other words, the silicon precursor can comprise an oxygen atom that is bonded to silicon and to boron.

In some embodiments, the silicon precursor comprises a silicon-phosphorous bond. In some embodiments, the silicon precursor comprises a silicon-boron bond.

In some embodiments, a precursor according to formula ii), such as a precursor according to formula ii) in which X is P and R is methyl, can be employed in an embodiment of a method as described herein for forming a silicon carbide film, i.e. a film consisting of silicon, carbon, and optionally hydrogen. Suitably, a silicon carbide film can be made using a precursor according to formula ii) and a plasma gas selected from the list consisting of $Ar/H_2$, Ar, He, and $He/H_2$ plasma; in which an $Ar/H_2$ refers to a plasma of which the plasma gas consists essentially of Ar and $H_2$, an Ar plasma refers to a plasma of which the plasma gas consists essentially of Ar, a He plasma refers to a plasma of which the plasma gas consists essentially of He, and a $He/H_2$ plasma refers to a plasma of which the plasma gas consists essentially of He and $H_2$.

In some embodiments, a precursor according to formula ii), such as a precursor according to formula ii) in which X is P and R is H, can be employed in an embodiment of a method as described herein for forming a silicon film, i.e. a film consisting of silicon and optionally hydrogen. Suitably, a silicon film can be made using a precursor according to formula ii) and a plasma gas selected from the list consisting of $Ar/H_2$, Ar, He, and $He/H_2$ plasma; in which an $Ar/H_2$ refers to a plasma of which the plasma gas consists essentially of Ar and $H_2$, an Ar plasma refers to a plasma of which the plasma gas consists essentially of Ar, a He plasma refers to a plasma of which the plasma gas consists essentially of He, and a $He/H_2$ plasma refers to a plasma of which the plasma gas consists essentially of He and $H_2$.

In some embodiments, the silicon precursor has a structure according to formula iii)

iii)

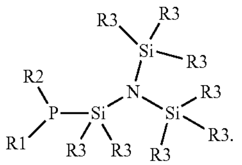

It shall be understood that in formula iii), R1 and R2 are independently selected from silyl, alkylsilyl, and an alkylamino group; and R3 is H or hydrocarbyl. Suitable hydrocarbyls include alkyls, aryls, and alkenyls.

In some embodiments, a precursor according to formula iii), such as a precursor according to formula iii) wherein R1 and R2 are trimethylsilyl and R3 is H, can be employed in an embodiment as described herein combined with a plasma such a plasma selected from the list consisting of $Ar/H_2$, Ar, He, $N_2/H_2$, $NH_3$, and $He/H_2$ plasma to form an SiCN or an SiN film. It shall be understood that SiCN film refers to a film substantially consisting of Si, C, N, and optionally H, an that SiN film refers to a film substantially consisting of Si, N, and optionally H.

In some embodiments, the silicon precursor has a structure according to formula iv)

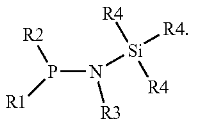

iv)

It shall be understood that in formula iv), R1 and R2 are independently selected from silyl and alkylsilyl, R3 is selected from H and alkylsilyl, and R4 is selected from H and hydrocarbyl. Suitable hydrocarbyls include alkyls, aryls, and alkenyls.

In some embodiments, R1 and R2 are silyl ortrimethylsilyl, R3 is H ortrimethylsilyl, and R4 is methyl. Such a precursor can be used in accordance with a method as disclosed herein in combination with an $Ar/H_2$, Ar, He, or $He/H_2$ plasma to form an SiCN layer, i.e. a film substantially consisting of Si, C, N, and optionally H.

In some embodiments, R1 and R2 are silyl, R3 is H or silyl, and R4 is H. Such a precursor can be used in accordance with a method as disclosed herein in combination with an $Ar/H_2$, Ar, He, or $He/H_2$ plasma to form an SiN layer, i.e. a film substantially consisting of Si, N, and optionally H.

In some embodiments, R1 and R2 are trimethylsilyl, R3 is H or silyl, and R4 is H. Such a precursor can be used in accordance with a method as disclosed herein in combination with an $Ar/H_2$, Ar, He, or $He/H_2$ plasma to form an SiCN layer, i.e. a film substantially consisting of Si, N, C, and optionally H.

In some embodiments, the silicon precursor has a structure according to formula v)

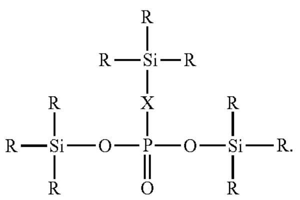

(v)

It shall be understood that in formula v), R is H or hydrocarbyl. Suitable hydrocarbyls include alkyls, aryls, and alkenyls. In some embodiments, X is phosphorous. In some embodiments, X is boron. In some embodiments, R is an alkyl. In some embodiments, R is methyl. In some embodiments, X is phosphorous and R is methyl.

In some embodiments, the silicon precursor is selected from the list consisting of Silanol, 1,1,1-trimethyl-, 1,1',1"-phosphite; Tris(trimethylsilyl) phosphate, Tris(triethylsilyl) phosphate; Silanol, 1,1,1-triethyl-, 1,1',4"-phosphite; Silanol, (1,1-dirriethylethyl)dirriethyl-, phosphite; Silanol, (1,1-dimethylethyDdimethyl-, phosphate; Silanol, trirnethyl-, phosphorothioate; Silanol, tripropyl-, phosphate; Silanol, 1,1,1-triphenyl-, 1,1',1"-phosphate; Silanol, tributyl-, phosphate; Silanol, ethyldimethyl-, phosphate; Silanol, ethenyldimethyl-, phosphate; Silanol, diethylmethyl-, phosphite; Silanol, tris(1-methylethyl)-, 1,1',1"-phosphite; Silanol, phosphate; Phosphoroseienoic acid, O,O,O-tris(trirnethylsilyi) ester; silanol, tripropyl-, 1,1',1"-phosphite; silanol, triethyl-, phosphorothioate; silanol, 1,1,1-triphenyl-, 1,1',1"-phosphite; silanol, diethylmethyl-, phosphate.

In some embodiments, the silicon precursor is selected from the list consisting of silanol, 1,1,1-trimethyl-, 1,1,1"-phosphite; tris(trimethylsilyl) phosphate; silanol, (1,1-dimethylethyl)dimethyl-,phosphite; silanol, 1,1,1-triethyl-, 1,1, 1"-phosphite; silanol, 1,1,1-triphenyl-, 1,1,1"-phosphate; Tris(triethylsilyl) phosphate; silanol, phosphate; silanol, ethenyldimethyl-, phosphate (3:1); silanol, methylphenyl-, phosphate; octyl N-[tris[(trimethylsilyl)oxy]phosphoranylidene]sulfamate; phosphoroselenoic acid, O,O,O-tris (trimethylsilyl) ester; silanol, ethyldimethyl-, phosphate; disiloxanol, pentamethyl-, phosphate; and silanol, dimethylphenyl-, phosphate.

In some embodiments, a silicon precursor pulse comprises a precursor sub-pulse and a precursor sub-purge. The precursor sub-pulse and the precursor sub-purge can be repeated for a pre-determined amount of times, e.g. from at least 1 to at most 10 times, until the precursor pulse ends.

In some embodiments, the plasma is a direct capacitively coupled plasma and a plasma pulse comprises a plasma on sub-pulse and a plasma off sub-pulse. During the plasma on sub pulse, the plasma is generated, and during the plasma off sub-pulse, plasma generation is stopped.

A plasma pulse can suitably comprise exposing the substrate to a plasma treatment. The plasma treatment comprises generating a plasma. The plasma can be one of a remote plasma, an indirect plasma, and a remote plasma.

Plasmas can be suitably generated by means of a plasma gas. Plasma gasses are gasses, vapors, gas mixtures, or a combination thereof that are provided to a space in which a plasma is generated. Suitable plasma gasses include $H_2$, $N_2$, and noble gasses such as He and Ar.

In some embodiments, the plasma is a direct capacitively coupled plasma generated between a showerhead injector and the substrate. In some embodiments, a direct capacitively coupled plasma can employ a plasma power from at least 175 W to at most 300 W.

In some embodiments, the plasma is an $Ar/H_2$ plasma. In other words, and in some embodiments, the plasma employs a plasma gas that substantially consists of Ar and $H_2$. In some embodiments, the plasma is an Ar plasma. In other words, and in some embodiments, the plasma employs a plasma gas that substantially consists of Ar. In some embodiments, the plasma is a He plasma. In other words, and in some embodiments, the plasma employs a plasma gas that substantially consists of He. In some embodiments, the plasma is an $N_2/H_2$ plasma. In other words, and in some embodiments, the plasma employs a plasma gas that substantially consists of $N_2$ and $H_2$. In some embodiments, the plasma is an NH 3 plasma. In other words, and in some embodiments, the plasma employs a plasma gas that substantially consists of NH 3. In some embodiments, the plasma is a $He/H_2$ plasma. In other words, and in some embodiments, the plasma employs a plasma gas that substantially consists of He and $H_2$.

In some embodiments, the substrate is maintained at a temperature of at least 200° C. to at most 600° C., or at a temperature of at least 300° C. to at most 500° C., or at a temperature of at least 400° C. to at most 600° C., or at a temperature of around 400° C. during the deposition cycles.

In some embodiments, the method comprises bringing the silicon precursor from a silicon precursor source to the reaction chamber. The silicon precursor source can be suitably maintained at a temperature of at least 20° C. to at most 100° C., or at a temperature of at least to at most 80° C., or at a temperature of at least 40° C. to at most 60° C., for example at a temperature of 50° C.

In some embodiments, the silicon precursor is provided to the reaction chamber via a showerhead injector. In some embodiments, the showerhead injector is maintained at a showerhead injector temperature of at least 50° C. to at most 200° C., or at least 60° C. to at most 180° C., or of at least 70° C. to at most 160° C., or of at least 80° C. to at most 140° C., or of at least 100° C. to at most 120° C. When a showerhead injector is used, a direct plasma configuration can be suitably employed.

In some embodiments, reaction chamber is maintained at a pressure of at least 200 Pa to at most 2000 Pa, or at a pressure from at least 500 Pa to at most 1000 Pa.

The layer comprising silicon having a desired thickness can be formed on the substrate by executing a suitable number of deposition cycles. The total number of deposition cycles comprised in a method as described herein depends, inter alia, on the total layer thickness that is desired. In some embodiments, the method comprises from at least 2 deposition cycles to at most 5 deposition cycles, or from at least 5 deposition cycles to at most 10 deposition cycles, or from at least 10 deposition cycles to at most 20 deposition cycles, or from at least 20 deposition cycles to at most 50 deposition cycles, or from at least 50 deposition cycles to at most 100 deposition cycles, or from at least 100 deposition cycles to at most 200 deposition cycles, or from at least 200 deposition cycles to at most 500 deposition cycles, or from at least 500 deposition cycles to at most 1000 deposition cycles, or from at least 1000 deposition cycles to at most 2000 deposition cycles, or from at least 2000 deposition cycles to at most 5000 deposition cycles, or from at least 5000 deposition cycles to at most 10000 deposition cycles. For example, the layer comprising silicon can have a thickness of at least 1 nm to at most 20 nm, such as a thickness of 2 nm, 5 nm, 10 nm, and 15 nm.

Thus, a silicon-containing material can be formed that has a thickness of e.g. 0.2 to 0.6 Angstrom per cycle.

In some embodiments, a layer comprising silicon comprises from at least 1 to at most 5 atomic percent carbon.

In some embodiments, a layer comprising silicon comprises from at least 20 to at most 40 atomic percent nitrogen.

In some embodiments, a layer comprising silicon comprises from at least 20 to at most 35 atomic percent oxygen.

In some embodiments, a layer comprising silicon comprises from at least 5 to at most 15 atomic percent nitrogen.

In some embodiments, a layer comprising silicon comprises from at least 20 to at most 35 atomic percent silicon.

It shall be understood that the composition of a layer comprising silicon can be suitably measured using x-ray photoelectron spectroscopy (XPS).

Further described herein is a semiconductor processing apparatus. The semiconductor processing apparatus comprises a reaction chamber. The reaction chamber comprises a substrate support for supporting a substrate.

The system further comprises a heater. The heater is constructed and arranged to heat the substrate in the reaction camber.

The system further comprises a plasma module. The plasma module comprises a radio frequency power source that is constructed and arranged to generate a plasma. In some embodiments, the plasma module is arranged in a remote plasma configuration in which the plasma can be generated outside of the reaction chamber, and in which plasma-generated active species can be directed to the substrate. In some embodiments, the plasma module is arranged in an indirect plasma configuration in which the plasma can be generated in a plasma generation space comprised in the reaction chamber, the plasma generation space being separated from a substrate-containing space comprised in the reaction chamber by a conductive mesh plate or perforated plate, the substrate-containing space comprising the substrate. In some embodiments, the plasma module is arranged in a direct plasma configuration in which the plasma is generated in the reaction chamber and in which the plasma is not physically separated from the substrate.

The system further comprises a suitable amount of sources. For example, the system can comprise a plasma gas source in fluid connection with the plasma module, and a silicon precursor source in fluid connection with the reaction chamber via one or more precursor valves.

The system further comprises a controller. The controller is configured for causing the semiconductor processing apparatus to perform a method as described herein.

Optionally, the system is configured for providing the silicon precursor to the reaction chamber by means of a carrier gas. Suitable carrier gasses include noble gasses. In other words, in some embodiments, the semiconductor processing system comprises a gas injection system comprising a precursor delivery system that employs a carrier gas for carrying the precursor to one or more reaction chambers.

FIG. 1 shows a schematic representation of an embodiment of a system (100) as described herein. The system (100) comprises a reaction chamber (110) in which a plasma (120) is generated. In particular, the plasma (120) is generated between a showerhead injector (130) and a substrate support (140). This is a direct plasma configuration employing a capacitively coupled plasma.

In the configuration shown, the system (100) comprises two alternating current (AC) power sources: a high frequency power source (121) and a low frequency power source (122). In the configuration shown, the high frequency power source (121) supplies radio frequency (RF) power to the showerhead injector, and the low frequency power source (122) supplies an alternating current signal to the substrate support (140). The radio frequency power can be provided, for example, at a frequency of 13.56 MHz or higher, e.g. at a frequency of at least 100 kHz to at most 50 MHz, or at a frequency of at least 50 MHz to at most 100 MHz, or at a frequency of at least 100 MHz to at most 200 MHz, or at a frequency of at least 200 MHz to at most 500 MHz, or at a frequency of at least 500 MHz to at most 1000 MHz, or at a frequency of at least 1000 MHz to at most 2000 MHz. The low frequency alternating current signal can be provided, for example, at a frequency of 2 MHz or lower, such as at a frequency of at least 100 kHz to at most 200 kHz, or at a frequency of at least 200 kHz to at most 500 kHz, or at a frequency of at least 500 kHz to at most 1000 kHz, or at a frequency of at least 1000 kHz to at most 2000 kHz.

Process gas comprising precursor, reactant, or both, is provided through a gas line (160) to a conical gas distributor (150). The process gas then passes through holes (131) in the showerhead injector (130) to the reaction chamber (110).

Whereas the high frequency power source (121) is shown as being electrically connected to the showerhead injector, and the low frequency power source (122) is shown as being electrically connected to the substrate support (140), other configurations are possible as well. For example, in some embodiments (not shown), both the high frequency power source and the low frequency power source can be electrically connected to the showerhead injector; or both the high frequency power source and the low frequency power source can be electrically connected to the substrate support; or the high frequency power source can be electrically connected to the substrate support, and the low frequency power source can be electrically connected to the showerhead injector.

Figure 2:
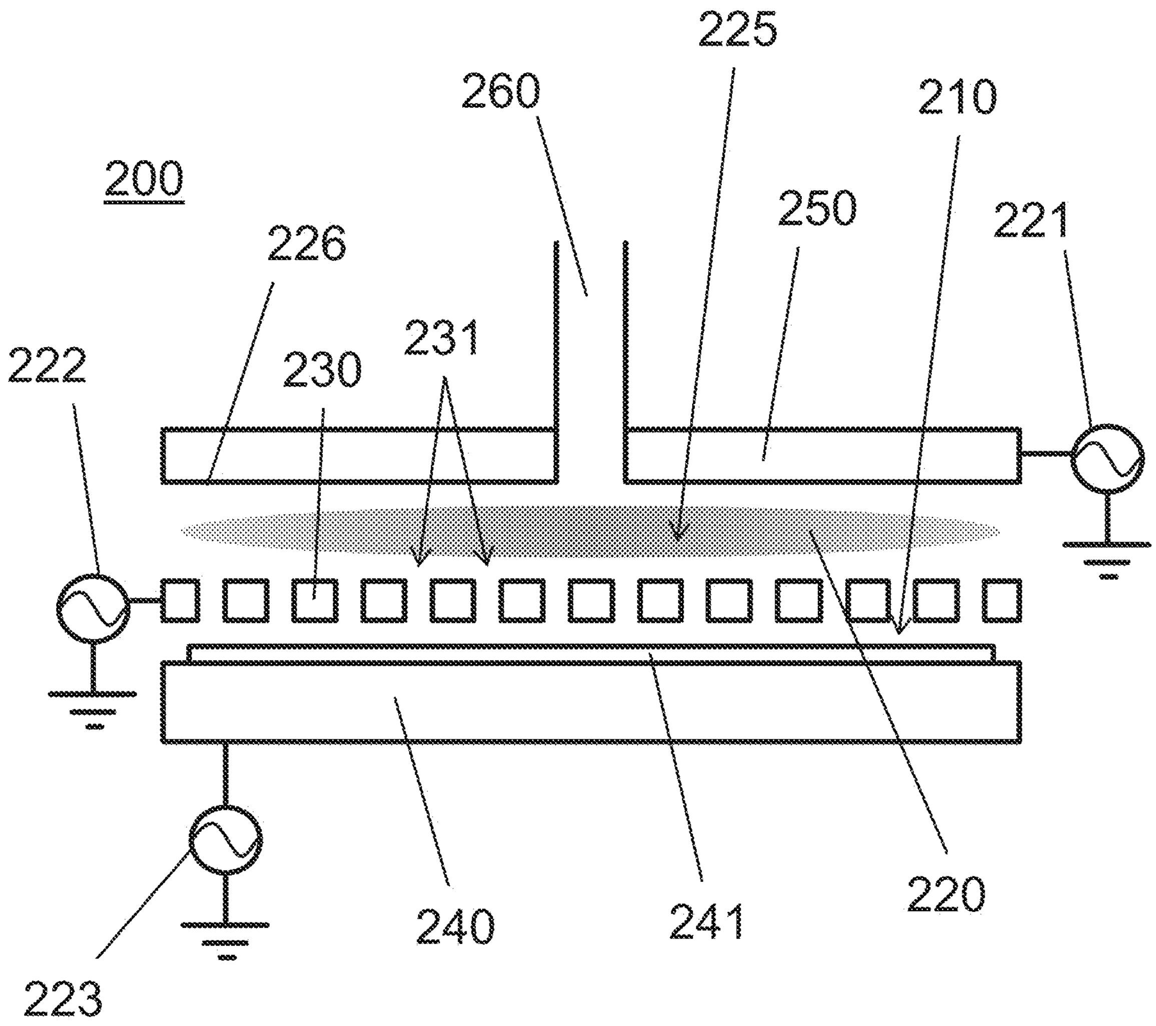
FIG. 2 shows a schematic representation of another embodiment of a system (200) as described herein.

FIG. 2 shows a schematic representation of another embodiment of a system (200) as described herein. The configuration of FIG. 2 can be described as an indirect plasma system. The system (200) comprises a reaction chamber (210) which is separated from a plasma generation space (225) in which a plasma (220) is generated. In particular, the reaction chamber (210) is separated from the plasma generation space (225) by a showerhead injector, and the plasma (220) is generated between the showerhead injector (230) and a plasma generation space ceiling (226).

In the configuration shown, the system (200) comprises three alternating current (AC) power sources: a high frequency power source (221) and two low frequency power sources (222,223): a first low frequency power source (222) and a second low frequency power source (223). In the configuration shown, the high frequency power source (221) supplies radio frequency (RF) power to the plasma generation space ceiling, the first low frequency power source (222) supplies an alternating current signal to the showerhead injector (230), and the second low frequency power source (223) supplies an alternating current signal to the substrate support (240). A substrate (241) is provided on the substrate support (240). The radio frequency power can be provided, for example, at a frequency of 13.56 MHz or higher. The low frequency alternating current signal of the first and second low frequency power sources (222,223) can be provided, for example, at a frequency of 2 MHz or lower.

Process gas comprising precursor, reactant, or both, is provided through a gas line (260) that passes through the plasma generation space ceiling (226), to the plasma generation space (225). Active species such as ions and radicals generated by the plasma (225) from the process gas pass through holes (231) in the showerhead injector (230) to the reaction chamber (210).

Figure 3:
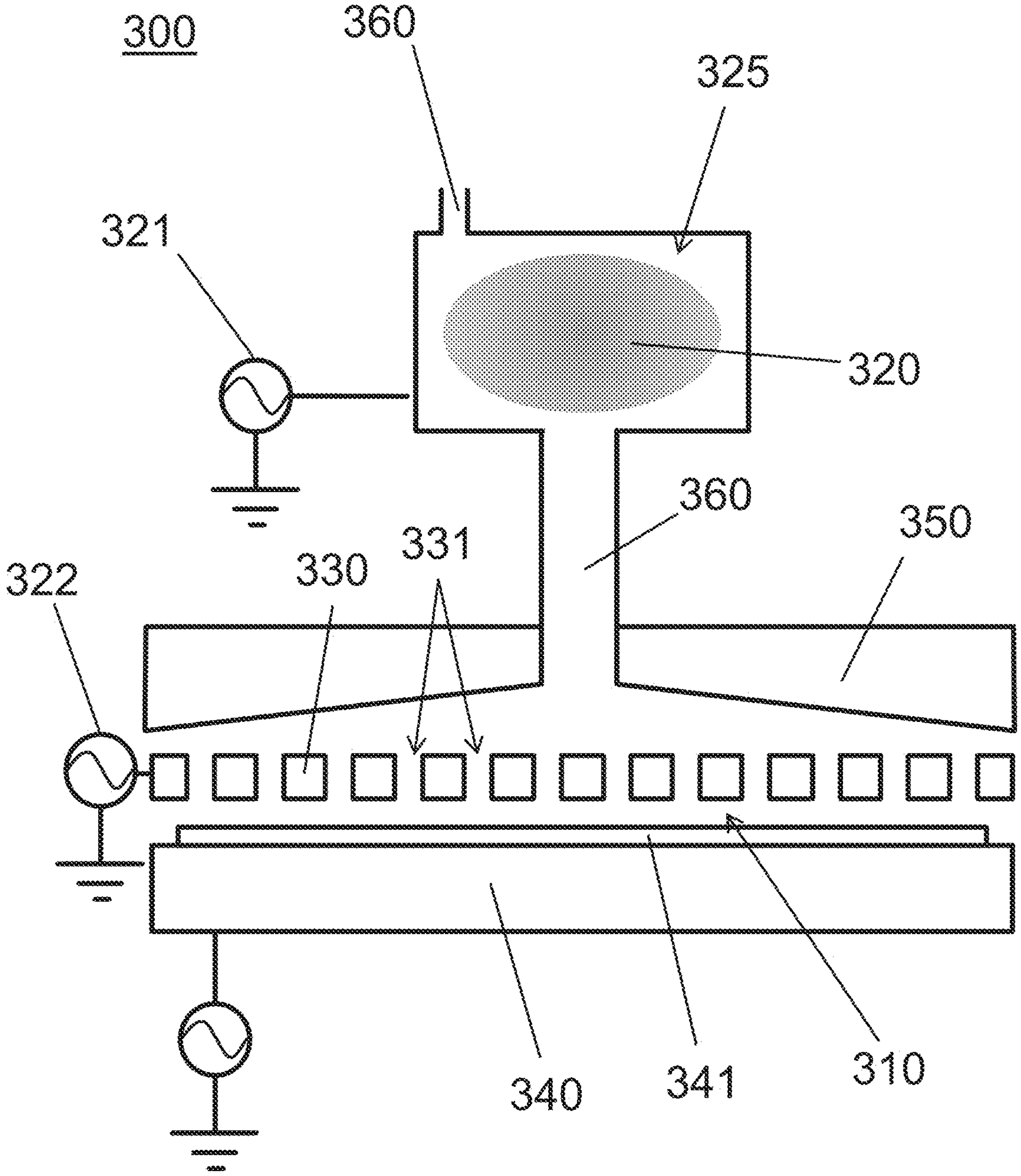
FIG. 3 shows a schematic representation of another embodiment of a system (300) as described herein.

FIG. 3 shows a schematic representation of another embodiment of a system (300) as described herein. The configuration of FIG. 3 can be described as a remote plasma system. The system (300) comprises a reaction chamber (310) which is operationally connected to a remote plasma source (325) in which a plasma (320) is generated. Any sort of plasma source can be used as a remote plasma source (325), for example an inductively coupled plasma, a capacitively coupled plasma, or a microwave plasma.

In particular, active species are provided from the plasma source (325) to the reaction chamber (310) via an active species duct (360), to a conical distributor (350), through holes (331) in a shower plate injector (330), to the reaction chamber (310). Thus, active species can be provided to the reaction chamber in a uniform way.

In the configuration shown, the system (300) comprises three alternating current (AC) power sources: a high frequency power source (321) and two low frequency power sources (822,823): a first low frequency power source (322) and a second low frequency power source (323). In the configuration shown, the high frequency power source (321) supplies radio frequency (RF) power to the plasma generation space ceiling, the first low frequency power source (322) supplies an alternating current signal to the showerhead injector (330), and the second low frequency power source (323) supplies an alternating current signal to the substrate support (340). A substrate (341) is provided on the substrate support (340). The radio frequency power can be provided, for example, at a frequency of 13.56 MHz or higher. The low frequency alternating current signal of the first and second low frequency power sources (322,323) can be provided, for example, at a frequency of 2 MHz or lower.

In some embodiments (not shown), an additional high frequency power source can be electrically connected to the substrate support. Thus, a direct plasma can be generated in the reaction chamber.

Process gas comprising precursor, reactant, or both, is provided to the plasma source (325) by means of a gas line (360). Active species such as ions and radicals generated by the plasma (325) from the process gas are guided to the reaction chamber (310).

Figure 4:
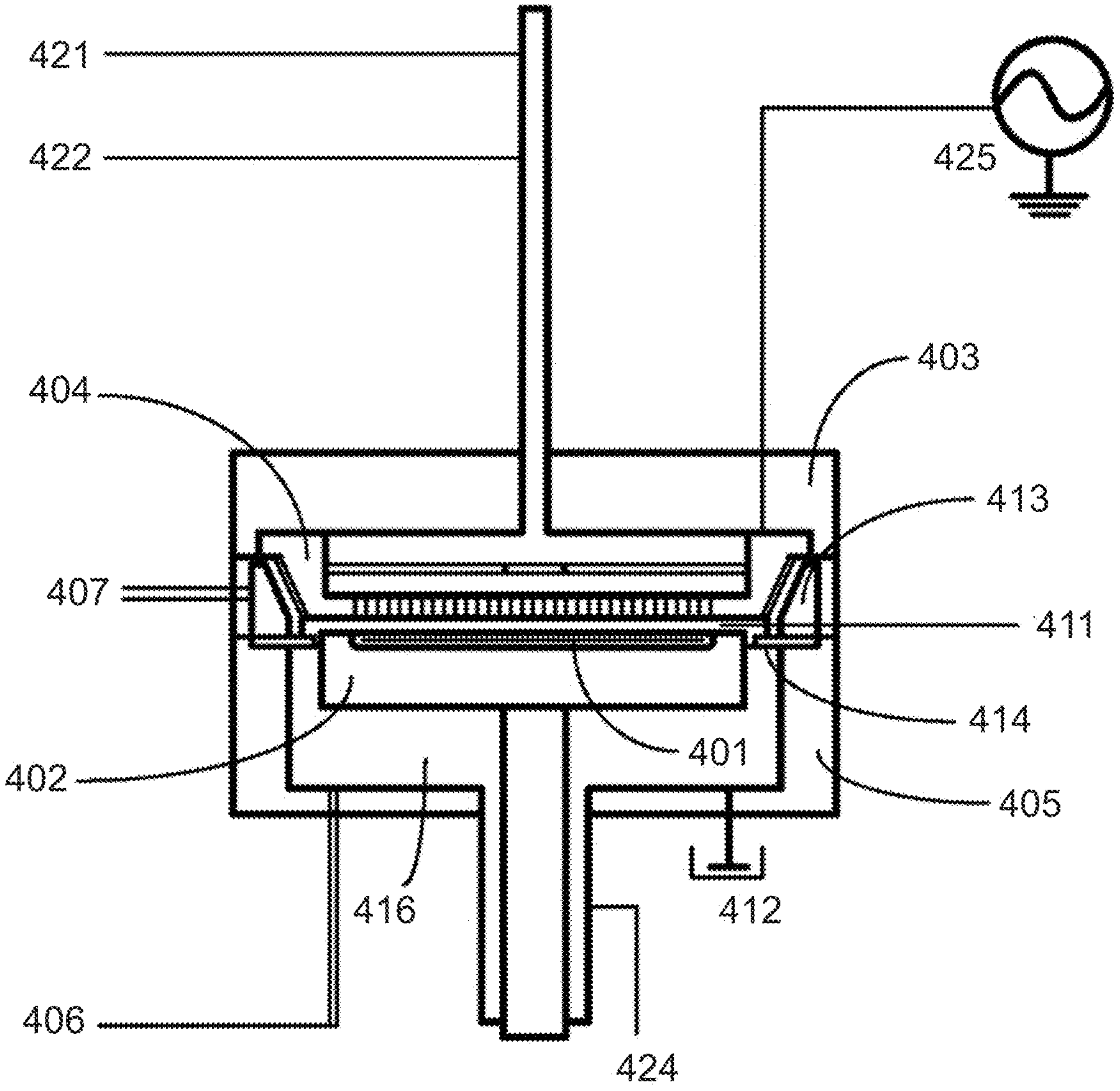
FIG. 4 is a schematic representation of a plasma-enhanced atomic layer deposition (PEALD) apparatus suitable for depositing a structure and/or for performing a method in accordance with at least one embodiment of the present disclosure.

The presently provided methods may be executed in any suitable apparatus, including in an embodiment of a semiconductor processing system as shown in FIG. 4. FIG. 4 is a schematic view of a plasma-enhanced atomic layer deposition (PEALD) apparatus, usable in some embodiments of the present invention. In this figure, by providing a pair of electrically conductive flat-plate electrodes (402,404) in parallel and facing each other in the interior (411) (reaction zone) of a reaction chamber (403), applying RF power (e.g. at 13.56 MHz and/or 27 MHz) from a power source (425) to one side, and electrically grounding the other side (412), a plasma can be generated between the electrodes. Of course, there is no need for the semiconductor processing apparatus to generate a plasma during the steps when a precursor is provided to the reaction chamber, or during purges between subsequent processing steps, and no RF power need be applied to any one of the electrodes during those steps or purges. A temperature regulator may be provided in a lower stage (402), i.e. the lower electrode. A substrate (401) is placed thereon and its temperature is kept constant at a given temperature. The upper electrode (404) can serve as a shower plate as well, and various gasses such as a plasma gas, a reactant gas and/or a dilution gas, if any, as well as a precursor gas can be introduced into the reaction chamber (403) through a gas line (421) and a gas line (422), respectively, and through the shower plate (404). Additionally, in the reaction chamber (403), a circular duct (413) with an exhaust line (417) is provided, through which the gas in the interior (411) of the reaction chamber (403) is exhausted. Additionally, a transfer chamber (405) is disposed below the reaction chamber (403) and is provided with a gas seal line (424) to introduce seal gas into the interior (411) of the reaction chamber (403) via the interior (416) of the transfer chamber (405) wherein a separation plate (414) for separating the reaction zone and the transfer zone is provided.

Note that a gate valve through which a wafer may be transferred into or from the transfer chamber (405) is omitted from this figure. The transfer chamber is also provided with an exhaust line (406).

Figure 5:
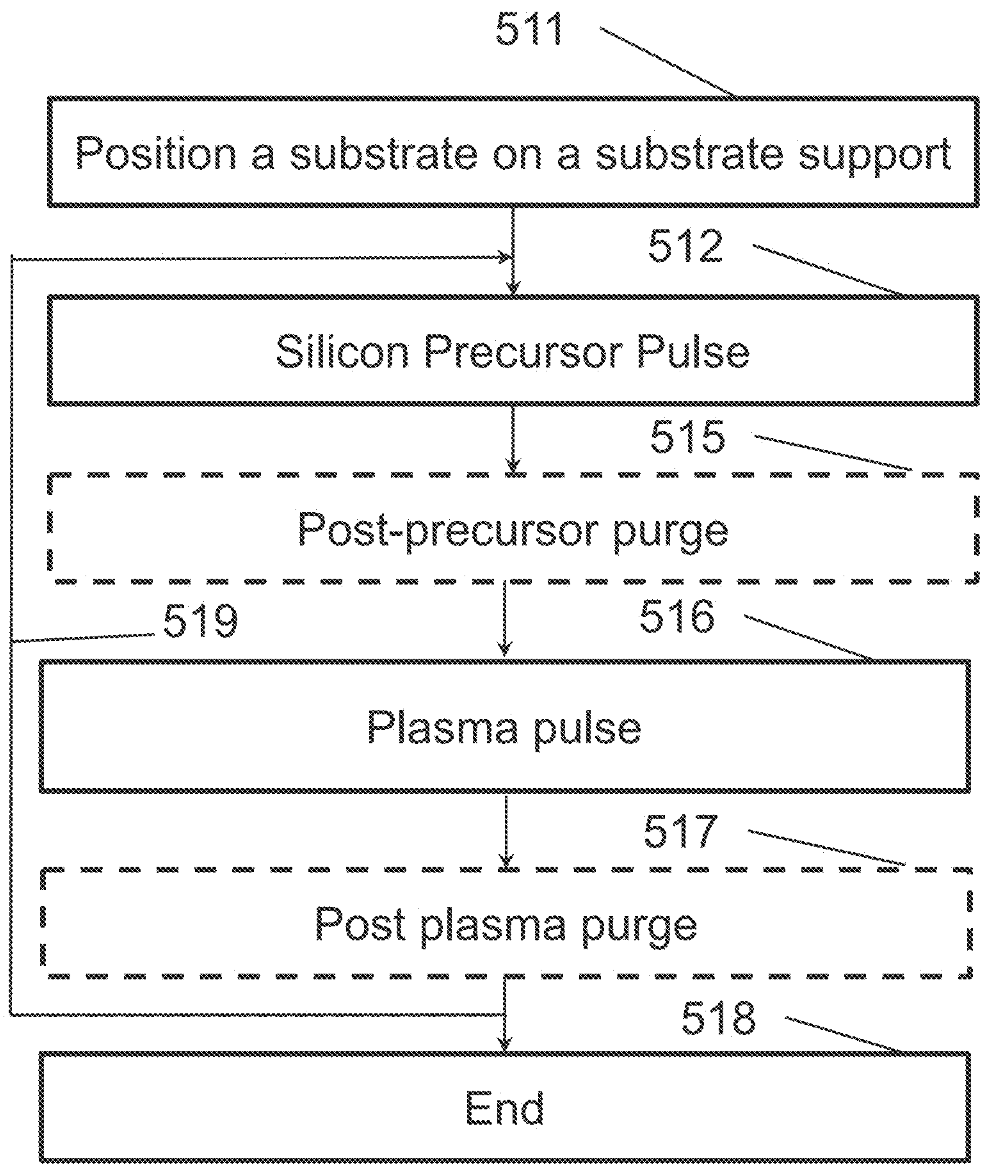
FIG. 5 shows a schematic representation of an embodiment of a method as described herein.

FIG. 5 shows a schematic representation of an embodiment of a method as described herein. The method comprises a step (511) of positioning a substrate on a substrate support. Then, the method comprises sequentially executing a plurality of deposition cycles (519). A deposition cycle (519) comprises a silicon precursor pulse (512) and a plasma pulse (516). The silicon precursor pulse (512) comprises exposing the substrate to a silicon precursor (512). The plasma pulse (516) comprises exposing the substrate to plasma-generated active species. The active species can be generated using a remote, direct, or indirect plasma configuration as explained elsewhere herein. It shall be understood that a silicon precursor pulse (512) and a plasma pulse (516) do not overlap, or do not substantially overlap. In other words, the silicon precursor pulse (512) and the plasma pulse (516) are carried out sequentially. In some embodiments, the precursor pulses (512) and the plasma pulses (516) are separated by purges (515,517). In other words, in some embodiments, the silicon precursor pulse (512) is followed by a post-precursor purge (515), and the plasma pulse (516) is followed by a post-plasma purge (517). Purging can be done, for example, by exposing the substrate to a noble gas. Exemplary noble gasses include He, Ne, Ar, Xe, and Kr. Thus, a silicon-containing material is formed on the substrate. When a desired amount of silicon-containing material has been formed on the substrate, the method ends (518).

Figure 6:
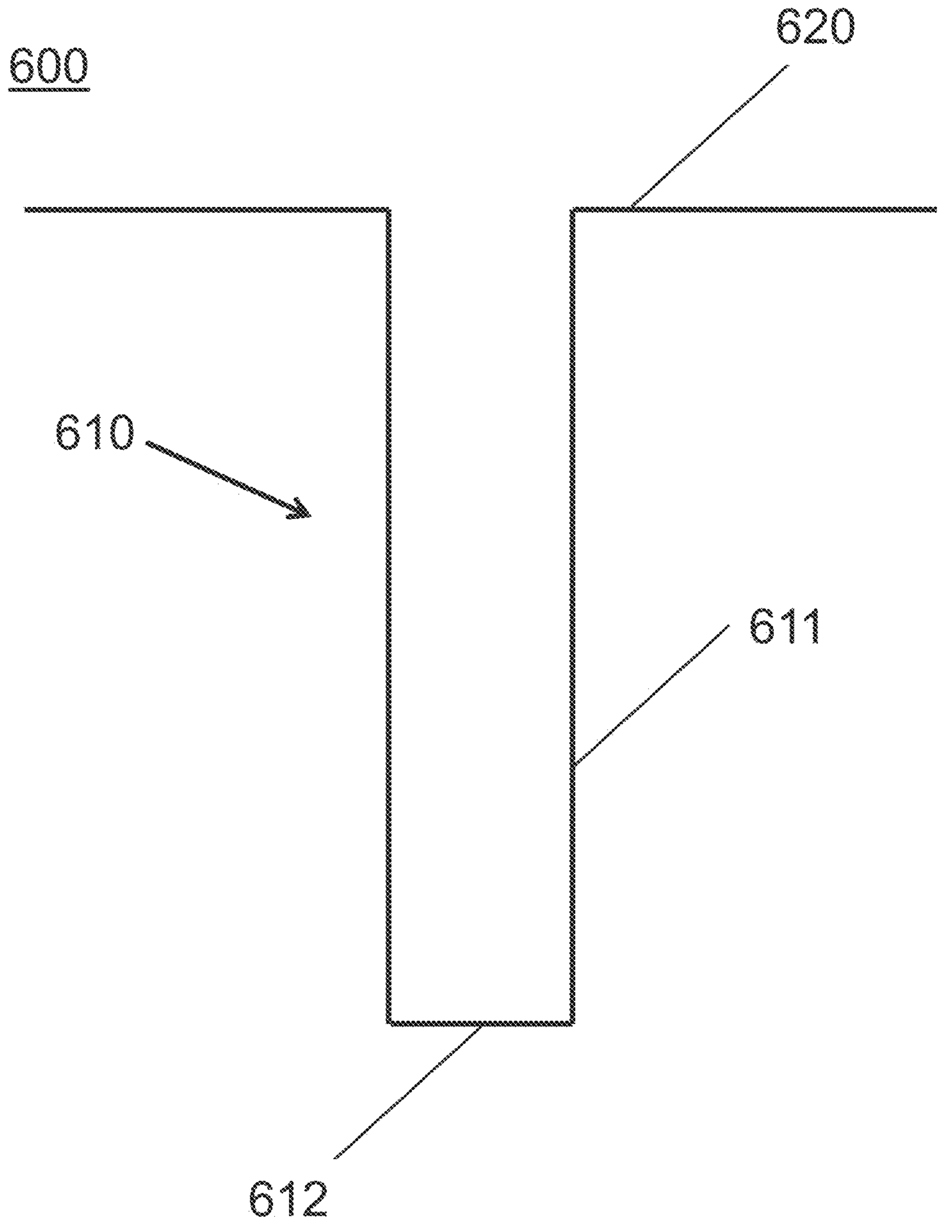
FIG. 6 shows a schematic representation of a substrate (600) comprising a gap (610).

FIG. 6 shows a schematic representation of a substrate (600) comprising a gap (610). The gap (610) comprises a sidewall (611) and a distal end (612). The substrate further comprises a proximal surface (620), i.e. a surface of the substrate outside of the gap. In some embodiments, the sidewall (611) and the distal end (612) comprise the same material. In some embodiments, at least one of the sidewall (611) and the distal end (612) comprise a dielectric, such as a silicon containing dielectric such as silicon oxide, silicon nitride, silicon carbide, and mixtures thereof. In some embodiments, the dielectric comprises hydrogen. In some embodiments, at least one of the sidewall (611) and the distal end (612) comprise a metal such as a transition metal, a post transition metal, and a rare earth metal. In some embodiments, the metal comprises Cu, Co, W, Ru, Mo, Al, or an alloy thereof.

In some embodiments, the sidewall (611) and the distal end (612) have an identical, or a substantially identical, composition. In some embodiments, the sidewall (611) and the distal end (612) have a different composition. In some embodiments, the sidewall and the distal end (612) comprise a dielectric. In some embodiments, the sidewall (611) and the distal end (612) comprise a metal. In some embodiments, the sidewall (611) comprises a metal and the distal end (612) comprises a dielectric. In some embodiments, the sidewall (611) comprises a dielectric and the distal end comprises a metal.

In some embodiments, the proximal surface (620) has the same composition as the sidewall (611). In some embodiments, the proximal surface (620) has a different composition than the sidewall (611). In some embodiments, the proximal surface (620) has a different composition than the distal end (612). In some embodiments, the proximal surface (620) has the same composition as the distal end (612).

In some embodiments, the proximal surface (620), the sidewall (611), and the distal end (612) comprise the same material. In some embodiments, the proximal surface (620), the sidewall (611), and the distal end (612) comprise a dielectric. In some embodiments, the proximal surface (620), the sidewall (611), and the distal end (612) comprise a metal. In some embodiments, the proximal surface (620), the sidewall (611), and the distal end (612) comprise a semiconductor.

In some embodiments, a layer formed in accordance with an embodiment of this disclosure has a step coverage of at least 90% to at most 110%, or of at least 95% to at most 105%, or of at least 99% to at most 101%, or of about 100%, in/on structures such as gaps (610) having aspect ratios (height/width) of more than about 2, more than about 5, more than about more than about 25, more than about 50, more than about 100, or between about 10 and 100 or about 5 to about 25. It shall be understood that the term "step coverage" refers to the growth rate of a layer on a distal end (612) of a recess, divided by the growth rate of that layer on a proximal surface (620), and expressed as a percentage.

Figure 7:
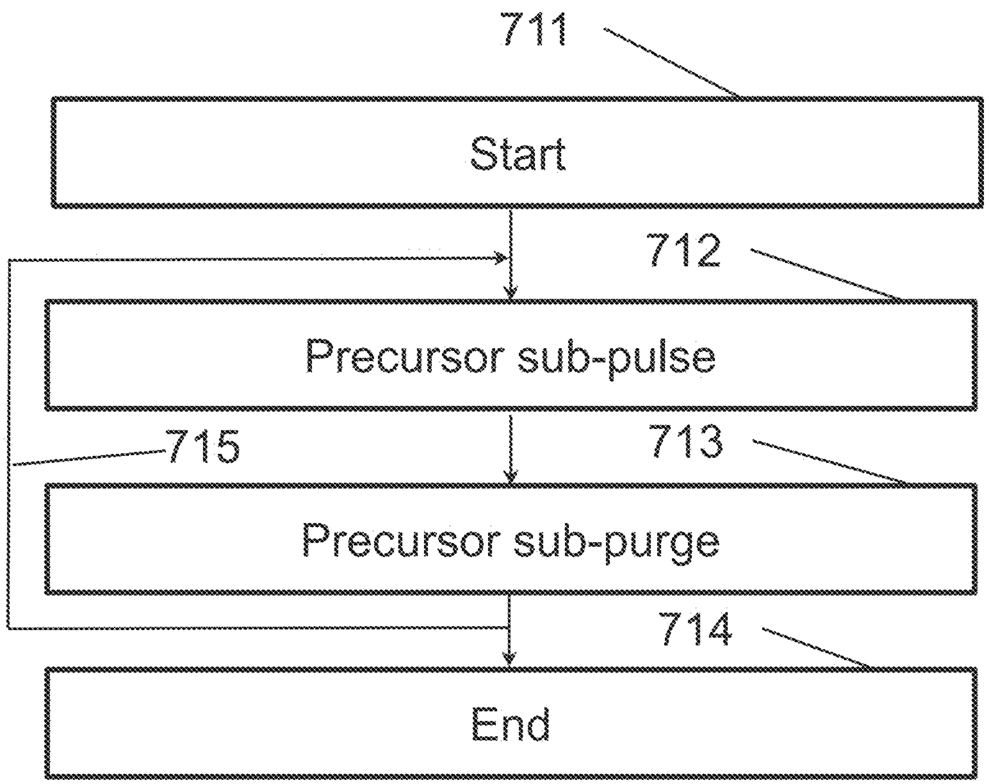
FIG. 7 shows an embodiment of a silicon precursor pulse, according to an exemplary method as disclosed herein.

FIG. 7 shows an embodiment of a silicon precursor pulse, according to an exemplary method as disclosed herein. The precursor pulse starts (711) and a precursor sub-pulse (712) is carried out. The precursor sub-pulse (712) is then followed by a precursor sub-purge (713). The precursor sub-pulse (712) and the precursor sub-purge (713) are then repeated (715) for a pre-determined amount of times, e.g. from at least 1 to at most 10 times, until the precursor pulse ends (714).

Of course, it shall be understood that a silicon precursor pulse does not necessarily comprise a plurality of sub-pulses and sub-purges. Indeed, in alternative embodiments, a silicon precursor comprises providing a silicon precursor to the reaction chamber for a pre-determined amount of time until the silicon precursor pulse ends.

Figure 8:
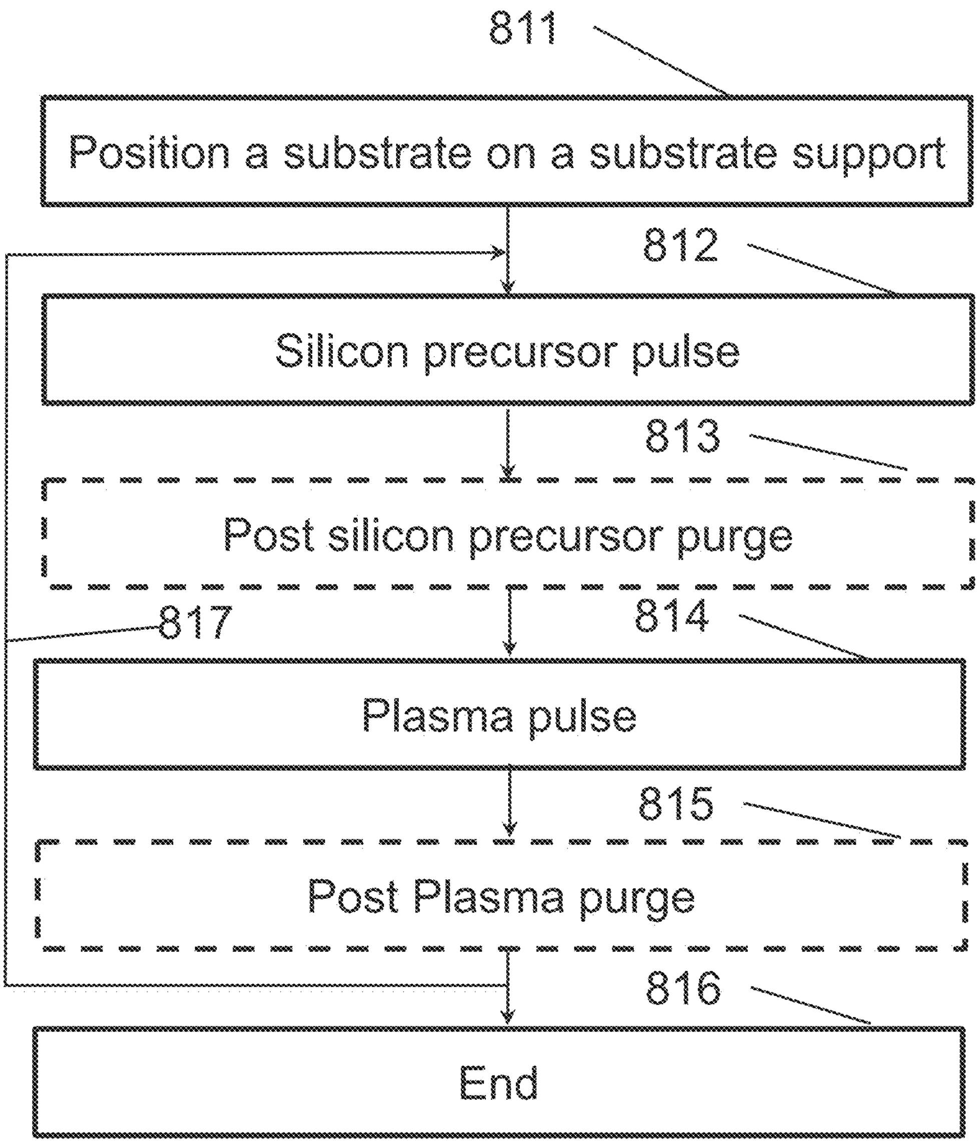
FIG. 8 shows a schematic representation of a method as described herein.

FIG. 8 shows a schematic representation of a method as described herein. The method comprises a step (811) of positioning a substrate on a substrate support. Then the method comprises cyclically executing a plurality of deposition cycles (817), i.e. multiple deposition cycles are carried out one after the other. A deposition cycle (817) comprises a silicon precursor pulse (812) and a plasma pulse (814). In some embodiments, the silicon precursor pulse (812) is followed by a post silicon precursor purge (813). In some embodiments, the plasma pulse (814) is followed by a post plasma purge (815). After a pre-determined amount of deposition cycles (817) have been carried out, the method ends (818), and a material comprising silicon has ben formed on the substrate.

Figure 9:
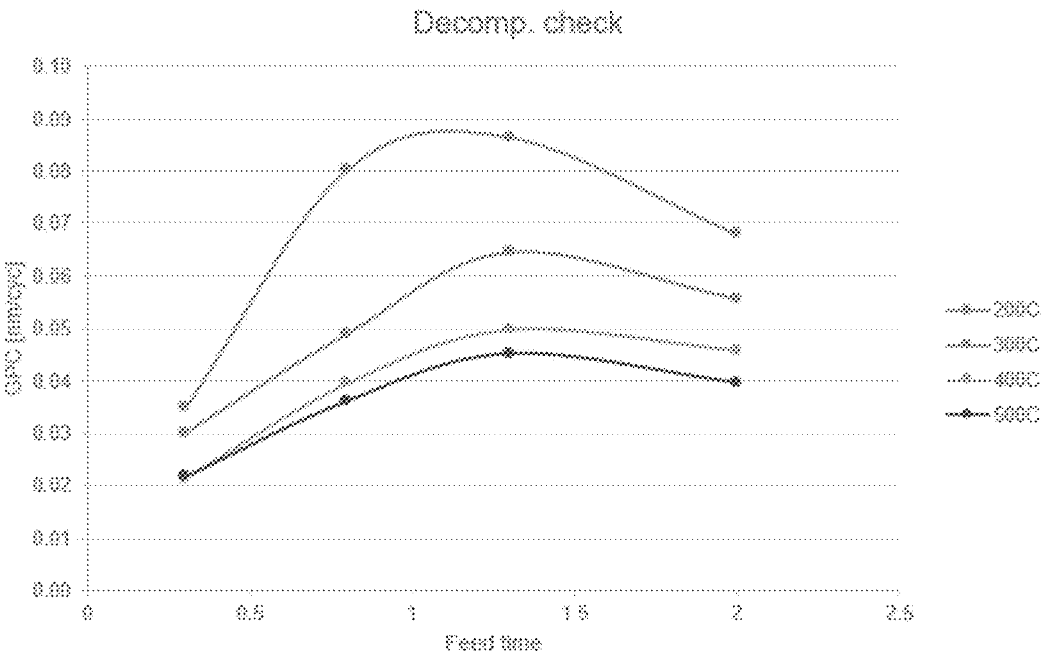
FIG. 9 shows experimental saturation curves obtained using a plasma-enhanced atomic layer deposition process according to an embodiment of the method of FIG. 8.

FIG. 9 shows experimental saturation curves obtained using a plasma-enhanced atomic layer deposition process according to an embodiment of the method of FIG. 8. In particular, the silicon precursor was

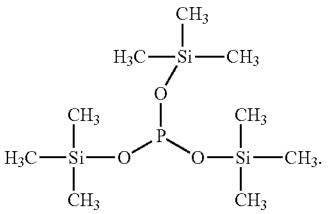

During the plasma pulses, a plasma employing a plasma gas that consists of Ar and $H_2$ was used. The silicon precursor was provided to the reaction chamber using a carried gas that consists of Ar. FIG. 9 shows the occurrence of self-limiting growth in the 200-500° C. temperature range. Layers formed at temperatures higher than 300° C. were found to show superior resistance to various etchants.

Such a process can be suitably carried out employing a capacitively coupled direct plasma generated between a showerhead injector and the substrate. Exemplary reaction conditions for such a process include: plasma power from at least 175 W to at most 300 W, pressure from at least 500 Pa to at most 1000 Pa, and susceptor temperature from at least 300° C. to at most 500° C. It is believed that self-saturating growth also occurs at even higher temperatures. This yielded a layer having a refractive index of at least 1.7 to at most 2.2, and a growth per cycle of at least 0.27 angstrom per cycle to at most 0.55 angstrom per cycle, while exhibiting a very low wet etch rate of at most 0.26 angstrom per minute in 1.5% aqueous HF. Remarkably, the formed films did not contain any phosphorous, as evidenced by x-ray photoelectron spectroscopy which indicates formation of volatile phosphorous-containing species during plasma-enhanced atomic layer deposition.

Figure 10:
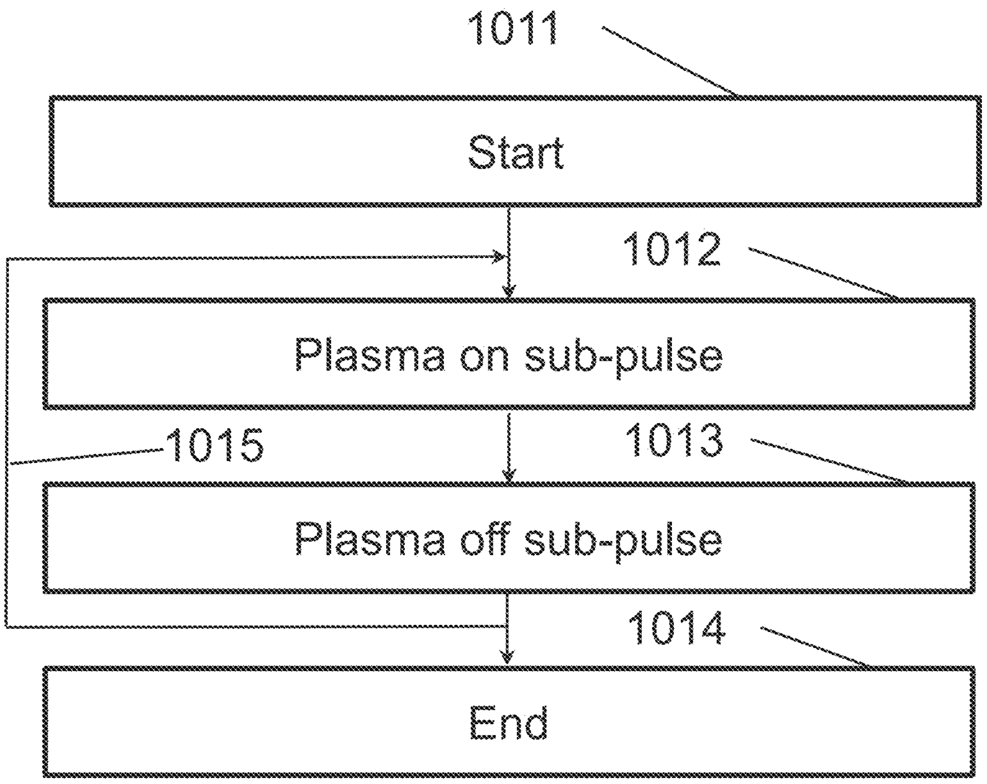
FIG. 10 shows an embodiment of a plasma pulse, as can be used in an exemplary method as disclosed herein.

FIG. 10 shows an embodiment of a plasma pulse, as can be used in an exemplary method as disclosed herein. Such a plasma pulse can be advantageously employed when a direct capacitively coupled plasma is employed. The plasma pulse starts (1011) and a plasma on sub-pulse (1012) is carried out. During a plasma on sub pulse (1012) plasma is generated. The plasma on sub-pulse (1012) is then followed by a plasma off sub-pulse (1013). During the plasma off sub-pulse (1013), no plasma is generated. The plasma on sub-pulse (1012) and the plasma off sub-pulse (1013) are then repeated (1015) for a pre-determined amount of times, e.g. from at least 1 to at most 10 times, until the plasma pulse ends (1014).

Of course, it shall be understood that a plasma pulse does not necessarily comprise a plurality of plasma on and plasma off sub-pulses. Indeed, in alternative embodiments, a plasma pulse comprises continuously generating a plasma for a pre-determined amount of time until the plasma pulse ends.

Figure 11:
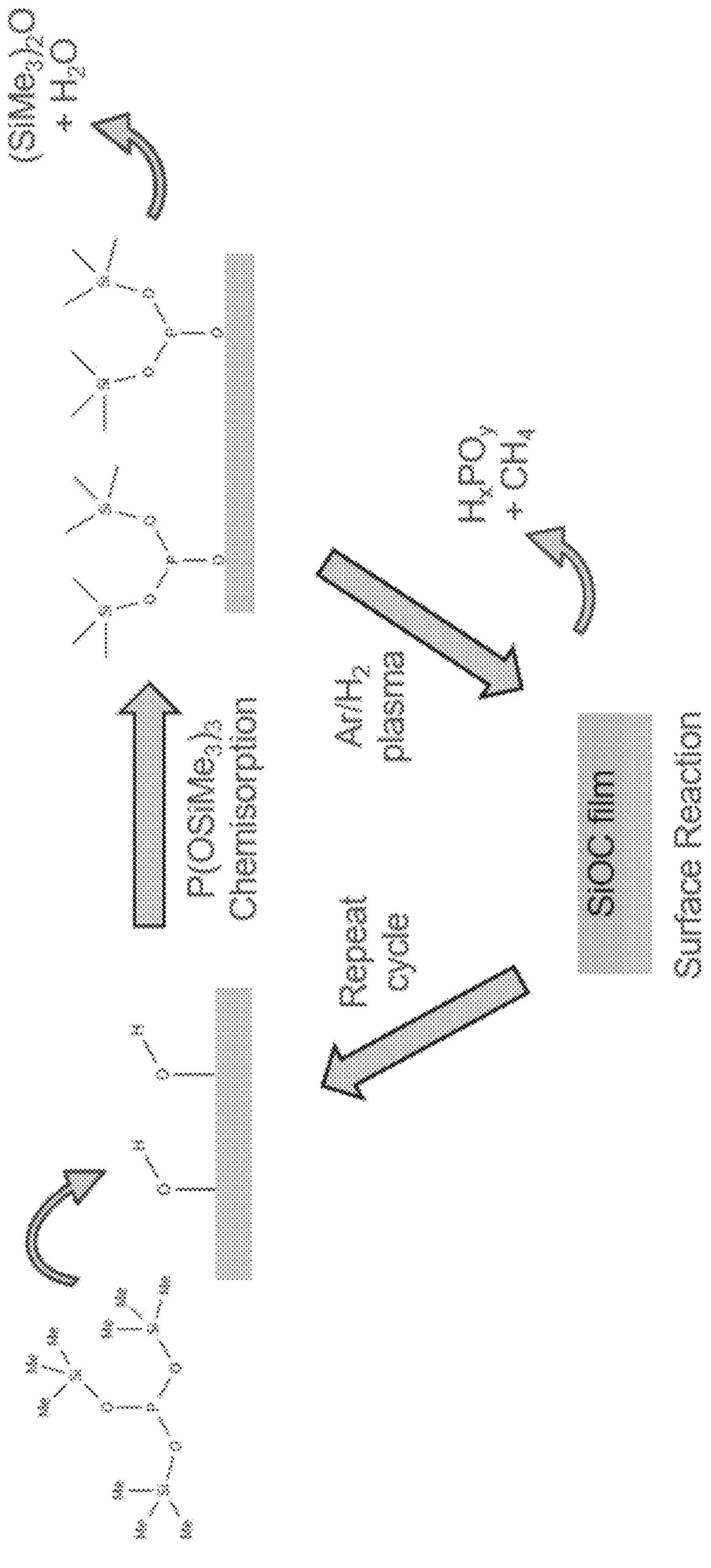
FIG. 11 shows an exemplary, non-limiting, possible reaction mechanism through which an embodiment of a method according to the present disclosure can operate.

FIG. 11 shows an exemplary, non-limiting, possible reaction mechanism through which an embodiment of a method according to the present disclosure can operate. In particular, FIG. 11 shows how an exposure of a hydroxyl-terminated substrate to a tris(trimethylsilyl) phosphite precursor can result in chemisorption of —$P(OSiMe_3)_3$ groups, which can readily release $(SiMe_3)_2O$ and $H_2O$. This silicon precursor pulse is followed by a plasma pulse in which exposure to the substrate to an $Ar/H_2$ plasma occurs. It shall be understood that $Ar/H_2$ plasma refers to a plasma in which the plasma gas comprises Ar and $H_2$. Exposure to the $Ar/H_2$ plasma can result in formation of an SiOC film and release of $H_xPO_y$ and $CH_4$, in which $H_xPO_y$ stands for a chemical species consisting of H, P, and O; and in which SiOC film stands for film consisting essentially of Si, O, C, and optionally H. The silicon precursor pulse and the plasma pulse together form a deposition cycle, which can be repeated for a pre-determined amount of times to obtain an SiOC film having a pre-determined thickness.

Figure 12:
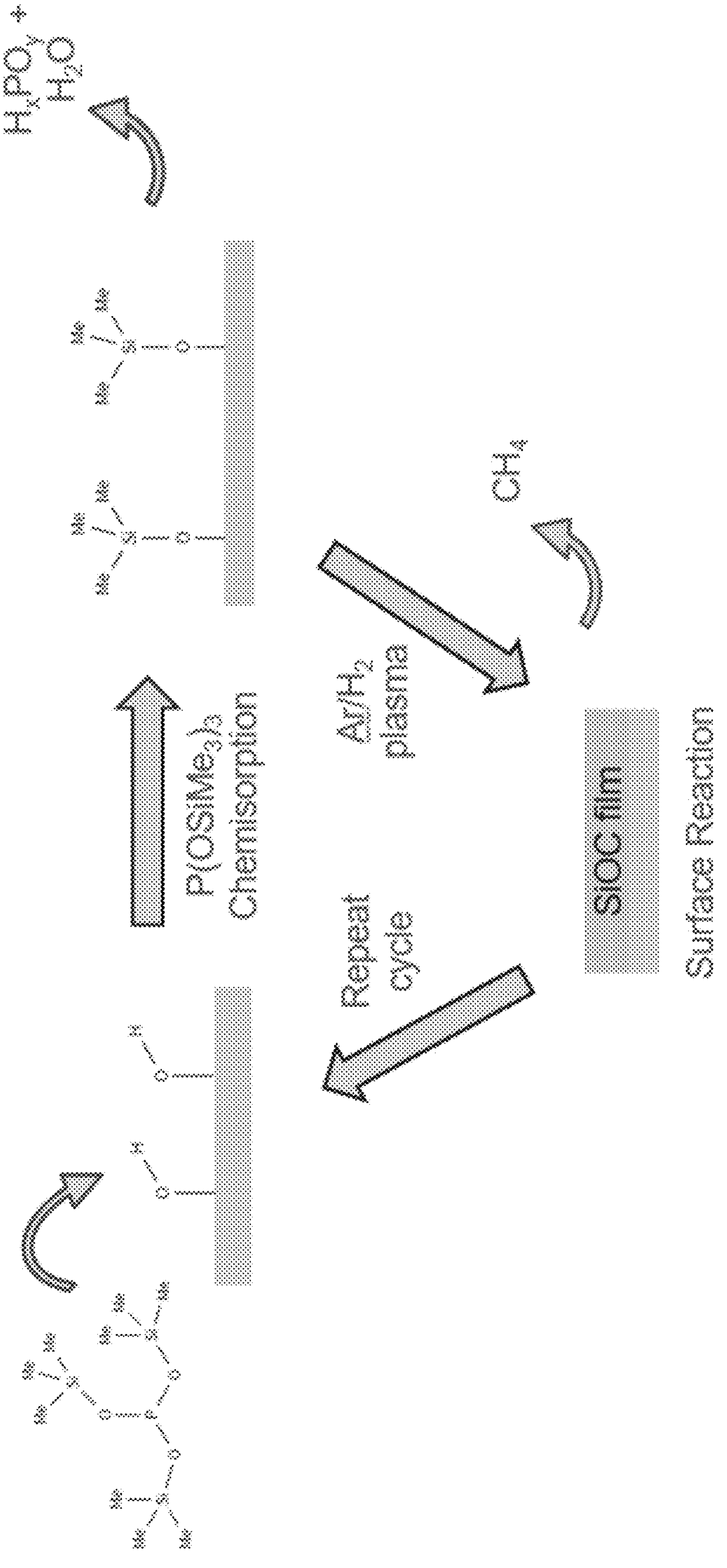
FIG. 12 shows an exemplary, non-limiting, possible reaction mechanism through which an embodiment of a method according to the present disclosure can operate.

It shall be understood that FIG. 11 is provided for illustrative purposes only, and the proposed reaction mechanism does not necessarily correspond with reality. Indeed, alternative reaction mechanisms are possible, such as the reaction mechanism illustrated in FIG. 12. FIG. 12 shows an exemplary, non-limiting, possible reaction mechanism through which an embodiment of a method according to the present disclosure can operate. In particular, FIG. 12 shows how an exposure of a hydroxyl-terminated substrate to a tris(trimethylsilyl) phosphite precursor can result in chemisorption of —$P(OSiMe_3)_3$ groups, which can readily release $H_xPO_y$ and $H_2O$; in which $H_xP_{Oy}$ stands for a chemical species consisting of H, P, and O. This silicon precursor pulse is followed by a plasma pulse in which exposure to the substrate to an $Ar/H_2$ plasma occurs. It shall be understood that $Ar/H_2$ plasma refers to a plasma in which the plasma gas comprises Ar and $H_2$. Exposure to the $Ar/H_2$ plasma can result in formation of an SiOC film and release of $CH_4$, in which SiOC film stands for film consisting essentially of Si, O, C, and optionally H. The silicon precursor pulse and the plasma pulse together form a deposition cycle, which can be repeated for a pre-determined amount of times to obtain an SiOC film having a pre-determined thickness.

Figure 13:
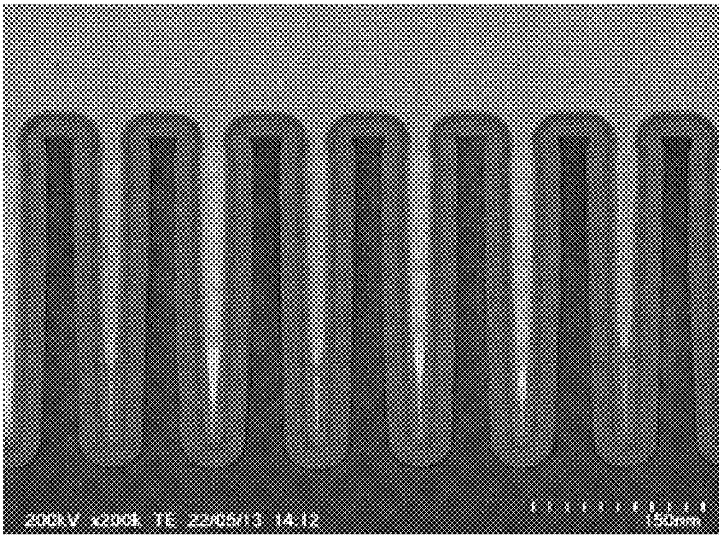
FIG. 13 shows a transmission electron micrograph of a layer that is formed using an embodiment of a method as described herein.

FIG. 13 shows experimental results obtained using an embodiment of a process according to FIG. 8. In particular, the silicon precursor used in this exemplary embodiment has the following structure:

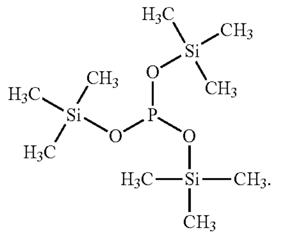

During the plasma pulses, a plasma was used that employs a plasma gas comprising $N_2$. $N_2$ was provided to the reaction chamber at a flow rate of 8 standard liters per minute (slm). The substrate was a patterned 300 mm silicon wafer supported by a susceptor having a temperature of 500° C. The reaction chamber was maintained at a pressure of 3000 Pa. A capacitively coupled direct plasma and a plasma power of 1000 W at 13.56 MHz was used during the plasma pulses. Purges were used during the precursor pulses and the plasma pulses.

As shown in FIG. 13, the resulting layer showed excellent conformality. It had the following composition, as evidenced by X-Ray Photoelectron Spectroscopy (XPS): 2 atomic percent carbon, 38 atomic percent nitrogen, 22 atomic percent oxygen, 10 atomic percent phosphorous, and 27 atomic percent silicon. The layer had a refractive index of 1.85 at a wavelength of 633 nm, and a k-value of 7.4 as measured at frequencies of 1 kHz, 10 kHz, and 100 kHz. Furthermore, the layer exhibited a very low leakage current of 1 to 9E-9 A at an electric field strength of 2 MV/cm, and a high dielectric breakdown field strength of 17.3 MV/cm. The layer showed excellent uniformity across a 300 mm silicon wafer. The layer had a high growth rate of nm per cycle, a density of 2.8 g/$cm^3$, and showed negligible aging over a period of two weeks. The layer had a wet etch rate ratio of 0.10. The wet etch rate ratio is the ratio of the etch rate of the layer in question divided by the etch rate of $SiO_2$. As an etchant for determining the wet etch rate ratio, 1.5 vol. % HF in water was used. Etching experiments were carried out at room temperature.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method comprising, in the given order:

positioning a substrate on a substrate support in a reaction chamber; and executing a plurality of deposition cycles, the deposition cycles comprising:

a silicon precursor pulse that comprises:

a precursor sub-pulse that comprises exposing the substrate to a silicon precursor, the silicon precursor comprising silicon and one or more of a group 13 element and a group 15 element;

a precursor sub-purge that comprises exposing the substrate to a purge gas; and a plasma pulse that comprises exposing the substrate to a plasma treatment, wherein the plasma treatment comprises generating a plasma, thereby forming a layer comprising silicon on the substrate.

2. The method according to claim 1, wherein the silicon precursor comprises an oxygen atom that is bonded to silicon and to one of a group 13 element and a group 15 element.

3. The method according to claim 1, wherein the silicon precursor has a formula given by

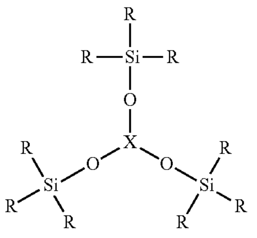

wherein X is selected from a group 13 element and a group 15 element, and wherein R is H or an alkyl.

4. The method according to claim 3, wherein X is phosphorous.

5. The method according to claim 3, wherein X is boron.

6. The method according to claim 3, wherein R is an alkyl.

7. The method according to claim 6, wherein R is methyl.

8. The method according to claim 1, wherein the silicon precursor has a formula given by

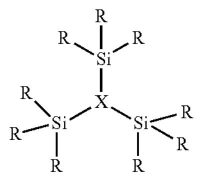

wherein X is selected from a group 13 element and a group 15 element, and wherein R is H or an alkyl.

9. The method according to claim 1, wherein the silicon precursor comprises a silicon-phosphorous bond.

10. The method according to claim 9, wherein the silicon precursor has a formula given by

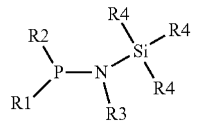

with R1 and R2 being independently selected from silyl and alkylsilyl, with R3 being selected from H and alkylsilyl, and with R4 being selected from H and alkyl.

11. The method according to claim 1, wherein the layer comprising silicon comprises one or more of elemental silicon, silicon oxide, silicon carbide, silicon nitride, silicon oxycarbide, silicon oxynitride, silicon carbonitride, and silicon oxycarbonitride.

12. The method according to claim 11, wherein the layer comprises silicon oxide.

13. The method according to claim 1, wherein the plasma is a direct plasma.

14. The method according to claim 1, wherein the plasma is a remote plasma.

15. The method according to claim 1, wherein the plasma is an indirect plasma.

16. The method according to claim 1, wherein the plasma is generated using a plasma gas, the plasma gas comprising one or more of a noble gas, $H_2$, and $N_2$.

17. The method according to claim 16, wherein the noble gas comprises one or more of He and Ar.

18. Th method according to claim 1, wherein during the deposition cycles, the substrate is maintained at a temperature of at least 200° C. to at most 600° C.

19. A method comprising, in the given order:

positioning a substrate on a substrate support in a reaction chamber; and executing a plurality of deposition cycles, the deposition cycles comprising:

a silicon precursor pulse that comprises:

a precursor sub-pulse that comprises exposing the substrate to a silicon precursor, the silicon precursor comprising silicon and one or more of a group 13 element and a group 15 element;

a precursor sub-purge that comprises exposing the substrate to a purge gas; and a plasma pulse that comprises exposing the substrate to a plasma treatment, wherein the plasma treatment comprises generating a plasma, thereby forming a layer comprising silicon on the substrate, wherein the silicon precursor has a formula given by

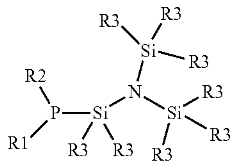

with R1 and R2 being independently selected from silyl and alkylsilyl, and with R3 being H or an alkyl.

20. A semiconductor processing apparatus comprising:

a reaction chamber comprising a substrate support for supporting a substrate;

a heater constructed and arranged to heat the substrate in the reaction chamber;

a plasma module comprising a radio frequency power source constructed and arranged to generate a plasma;

a plasma gas source in fluid communication with the plasma module;

a silicon precursor source in fluid connection with the reaction chamber via one or more precursor valves; and, a controller configured for causing the semiconductor processing apparatus to perform a method comprising:

positioning a substrate on a substrate support in a reaction chamber; and executing a plurality of deposition cycles, the deposition cycles comprising:

a silicon precursor pulse that comprises:

a precursor sub-pulse that comprises exposing the substrate to a silicon precursor, the silicon precursor comprising silicon and one or more of a group 13 element and a group 15 element; and a precursor sub-purge that comprises exposing the substrate to a purge gas; and a plasma pulse that comprises exposing the substrate to a plasma treatment, wherein the plasma treatment comprises generating a plasma, thereby forming a layer comprising silicon on the substrate.

* * * * *